US011466385B2

United States Patent
Chen et al.

(10) Patent No.: US 11,466,385 B2
(45) Date of Patent: *Oct. 11, 2022

(54) LARGE GRAIN QUASI-SINGLE-CRYSTAL FILM AND MANUFACTURING METHOD THEREOF

(71) Applicant: NATIONAL CHIAO TUNG UNIVERSITY, Hsinchu (TW)

(72) Inventors: Chih Chen, Hsinchu (TW); Yu-Jin Li, Hsinchu (TW)

(73) Assignee: NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 21 days.

This patent is subject to a terminal disclaimer.

(21) Appl. No.: 17/132,183

(22) Filed: Dec. 23, 2020

(65) Prior Publication Data

US 2022/0025550 A1 Jan. 27, 2022

(30) Foreign Application Priority Data

Jul. 27, 2020 (TW) .................................. 109125290

(51) Int. Cl.
*C30B 29/10* (2006.01)
*C30B 29/60* (2006.01)
(Continued)

(52) U.S. Cl.
CPC .............. *C30B 29/605* (2013.01); *C21D 9/46* (2013.01); *C30B 29/10* (2013.01); *C30B 33/02* (2013.01); *C21D 2201/05* (2013.01)

(58) Field of Classification Search
CPC ....... C30B 29/10; C30B 29/605; C30B 33/02; C30B 1/02; C21D 9/46; C21D 2201/05
See application file for complete search history.

(56) References Cited

U.S. PATENT DOCUMENTS 5,603,693 A * 2/1997 Frenkel .................. A61N 1/303
604/20
5,605,581 A * 2/1997 Inoue ...................... H01J 29/07
148/310

(Continued)

FOREIGN PATENT DOCUMENTS

CN 103732768 A 4/2014
CN 107354506 A 11/2017
(Continued)

OTHER PUBLICATIONS

Examination Report for counterpart Chinese Application No. 201910789903.5, dated Nov. 25, 2020.
(Continued)

*Primary Examiner* — Robert M Kunemund
(74) *Attorney, Agent, or Firm* — Rosenberg, Klein & Lee (57) ABSTRACT

A large grain quasi-single-crystal film and a manufacturing method thereof are provided. The metal film having the <111> preferred orientation on its surface is subjected to mechanical tensile force to make the arrangement of crystal grains more ordered. The metal film is grown into a film with large crystal grains having an average diameter of over 500 microns by annealing at a temperature below the recrystallization temperature, thereby obtaining a large grain quasi-single-crystal film having the preferred directions of three axes. The large grain quasi-single-crystal film has a <110> preferred orientation along the tensile direction and a <211> preferred orientation along the direction vertical to the tensile force, and maintains a <111> preferred orientation on its top surface. The present invention can be used to produce highly anisotropic large-area quasi-single-crystal films, and can also be applied to grow 2-dimensional materials or develop anisotropic structures.

12 Claims, 7 Drawing Sheets

(51) Int. Cl.
*C30B 33/02* (2006.01)
*C21D 9/46* (2006.01)

(56) References Cited

U.S. PATENT DOCUMENTS

| | | | |
|---|---|---|---|
| 5,607,899 A | 3/1997 | Yoshida et al. | |
| 5,628,841 A * | 5/1997 | Inoue | C21D 8/0205 148/120 |
| 6,103,394 A * | 8/2000 | Okuda | C22C 38/60 148/579 |
| 6,180,570 B1 | 1/2001 | Goyal | |
| 6,740,421 B1 | 5/2004 | Goyal | |
| 7,078,108 B2 | 7/2006 | Zhang et al. | |
| 7,087,113 B2 | 8/2006 | Goyal | |
| 8,221,897 B2 * | 7/2012 | Muroga | H05K 1/09 148/411 |
| 10,094,033 B2 | 10/2018 | Chen et al. | |
| 10,626,485 B2 * | 4/2020 | Obata | C22C 38/60 |
| 2004/0195105 A1 | 10/2004 | Yoo et al. | |
| 2008/0113455 A1 | 5/2008 | Jain et al. | |
| 2009/0173414 A1 * | 7/2009 | Muroga | C22C 9/00 148/508 |
| 2010/0291402 A1 | 11/2010 | Muroga et al. | |
| 2016/0168746 A1 | 6/2016 | Chen et al. | |
| 2016/0355940 A1 | 12/2016 | Chen et al. | |

FOREIGN PATENT DOCUMENTS

| | | |
|---|---|---|
| CN | 107904654 A | 4/2018 |
| CN | 109652858 A | 4/2019 |
| TW | I432613 B | 4/2014 |
| TW | 201621091 A | 6/2016 |

OTHER PUBLICATIONS

Examination Report for counterpart Taiwanese Application No. 109125290, dated Dec. 24, 2020.
Field, et al. "Electron Backscatter Diffraction Characterization of Inlaid Cu Lines for Interconnect Applications." Scanning, 25(6) (Nov. 2003), pp. 309-315. doi: 10.1002/sca.4950250607.
Examination Report for counterpart Chinese Application No. 202010737961.6, dated Apr. 15, 2021.
Liu, et al. "Fabrication and Characterization of (111)-Oriented and Nanotwinned Cu by DC Electrodeposition." Crystal Growth & Design 12(10) (Aug. 2012), pp. 5012-5016. doi: 10.1021/cg300962v.
Huang, et al. "Grain Growth in Electroplated (111)-Oriented Nanotwined Cu." Scripta Materialia 89 (Oct. 2014), pp. 5-8. doi: 10.1016/j.scriptamat.2014.06.008.
Lu, et al. "Extremely Anisotropic Single-Crystal Growth in Nanotwinned Copper." NPG Asia Mats 6 (Oct. 2014), p. e135. doi: 10.1038/am.2014.90.
Li, et al. "Deformation Induced Columnar Grain Rotation in Nanotwinned Metals." Mats Sci & Eng A 797 (Aug. 2020), p. 140045. doi: 10.1016/j.msea.2020.140045.

* cited by examiner

LARGE GRAIN QUASI-SINGLE-CRYSTAL FILM AND MANUFACTURING METHOD THEREOF

This application claims priority of Application No. 109125290 filed in Taiwan on 27 Jul. 2020 under 35 U.S.C. § 119; the entire contents of all of which are hereby incorporated by reference.

BACKGROUND OF THE INVENTION

Field of the Invention

The present invention relates to a metal film growing technology, particularly to a large grain quasi-single-crystal film, which has significant preferred orientations in three axes and a manufacturing method thereof.

Description of the Prior Arts

In the conventional technology, the epitaxial technology, the electrodeposition technology, the deformation technology and the annealing technology are usually used to manufacture metal films having a preferred orientation.

In some researches, an electroplating process is used to grow an electrodeposited nano-twinned copper film having a significant preferred orientation <111> on the surface thereof, such as the U.S. Pat. No. 10,094,033. The electrodeposited nano-twinned copper film has superior thermal stability, wherein disordered crystal grains are effectively transformed into columnar nano-twinned copper crystal grains. An annealing process will transform the <111> preferred orientation of the nano-twinned copper into a <100> preferred orientation. However, the prior art is still unable to control the preferred orientations of the other surfaces except the preferred orientation of the surface of the film.

About other prior arts, the U.S. Publication No. 20100291402 anneals high-deformation rolled copper doped with tin to generate a preferred orientation on the rolled surface. The U.S. Pat. No. 7,078,108 uses a magnetron sputtering method to fabricate copper foil whose surface has a preferred orientation <111>. However, the prior art is unable to realize mass-production. The U.S. Publication No. 20040195105 uses different waveforms, including direct current, pulses, and cycles of negative-direction current to directly fabricate a quasi-single-crystal copper film and controls the surface thereof to have a preferred orientation <100>. The U.S. Pat. No. 5,607,899 uses laser to excite a target material to deposit a monocrystalline metal film on a substrate and control the preferred orientation on the surface thereof. The conventional technology must be undertaken in a vacuum environment, and the requirement is unfavorable for mass production. The U.S. Pat. No. 6,180,570 deposits a metal film on a pre-shaped tube-like material, next plastically deforms the metal film, and then recrystallizes the deformed metal film to generate preferred orientations in two axes. However, the dual-axis preferred orientations will not appear unless the metal film is plastically deformed and annealed together with a deformable pre-shape tube-like material. The U.S. Pat. No. 7,087,113 uses deformation and recrystallization to generate a single crystal or subgrain boundaries. In the prior art, the material needs to be heated to a temperature higher than the temperature of secondary recrystallization; alternatively, seed crystals having a preferred orientation are annealed at a temperature higher than the temperature of secondary recrystallization to completely convert the material into a single crystal. The annealing temperature for copper is near 600° C. The U.S. Pat. No. 6,740,421 uses a rolling technology to obtain dual-axis preferred orientations of a substrate. Then, an epitaxial technology is used to directly deposit a film on the substrate having dual-axis preferred orientations.

The prior arts have the following problems:
(1) The epitaxial process is too low and too expensive to achieve mass production.
(2) The process of depositing a quasi-single crystal can only control the preferred orientation of the epitaxial surface, unlikely to control the preferred orientations of other directions.
(3) The prior arts must perform annealing at a temperature near the temperature of recrystallization to achieve three-axis preferred orientations; however, the prior arts are unlikely to create or maintain a (111) surface.

In order to overcome the abovementioned technological problems, it is necessary to develop a large grain quasi-single-crystal film featuring three-axis preferred orientations, which can be fabricated fast and economically to favor mass production and increase the application value thereof.

SUMMARY OF THE PRESENT INVENTION

The primary objective of the present invention is to provide a large grain quasi-single-crystal film and a manufacturing method thereof, wherein a mechanical force is applied to a metal film having a <111> preferred orientation to generate appropriate plastic deformation and make specified preferred orientations also appear in the tensile direction and the direction vertical to the tensile direction; after annealing, the film keeps the <111> preferred orientation thereof, and the crystals grow into large grain crystals, whereby to achieve a large grain quasi-single-crystal film having preferred orientation in three axis.

Another objective of the present invention is to provide a method for manufacturing a large grain quasi-single-crystal film, which can mass produce a large grain quasi-single-crystal film in a simple process and a high speed.

In order to achieve the abovementioned objectives, the present invention proposes a large grain quasi-single-crystal film, which comprises a plurality of close packed crystal grains. The crystal grains occupying over 50% area of the surface of the large grain quasi-single-crystal film have a <111> preferred orientation. After the large grain quasi-single-crystal film is plastically deformed by a mechanical tensile force and annealed, the crystal grains occupying over 50% area have a <110> preferred orientation in the tensile direction, and the crystal grains occupying over 50% area have a <211> preferred orientation in the direction vertical to the tensile direction. The average diameter of the crystal grains is over 500 μm.

The present invention also proposes a method for manufacturing a large grain quasi-single-crystal film, which comprises steps: providing a metal film including a plurality of close packed crystal grains, wherein the crystal grains in over 50% area of the surface of the metal film have a <111> preferred orientation; applying a mechanical tensile force to the metal film along a tensile direction until the metal film is plastically deformed, whereby to obtain a quasi-single-crystal film, wherein in addition to keeping the crystal grains in over 50% area of the surface having the <111> preferred orientation, the crystal grains in over 50% area have a <211> preferred orientation along the tensile direction, and the crystal grains in over 50% area have a <110> preferred orientation along the direction vertical to the tensile direction; annealing the quasi-single-crystal film at a temperature lower than the recrystallization temperature to obtain a large grain quasi-single-crystal film, wherein the crystal grains in over 50% area of the large grain quasi-single-crystal film have the <110> preferred orientation along the tensile direction, and the crystal grains in over 50% area of the large grain quasi-single-crystal film have the <211> preferred orientation along the direction vertical to the tensile direction of, and wherein the average diameter of the crystal grains is over 500 μm.

The present invention provides a large grain quasi-single-crystal film and a manufacturing method thereof, enabling the plastically deformed metal film to keep the original <111> preferred orientation in the surface thereof and further have preferred orientations in other two directions. In the present invention, the annealed metal film keeps the original <111> preferred orientation, and annealing makes the crystal grains of the metal film grow into large crystal grains. Therefore, the present invention outperforms the conventional technology of fabricating a quasi-single-crystal film in that the present invention can achieve three-axis preferred orientations and large crystal grains via merely plastically deforming and annealing the metal film. The present invention can fast fabricate a large grain quasi-single-crystal film in a simple process and a low cost. Therefore, the present invention can mass produce a large grain quasi-single-crystal film and has a high potential in the future industry.

Below, embodiments are described in detail in cooperation with the attached drawings to make easily the objectives, technical contents, characteristics and accomplishments of the present invention.

DETAILED DESCRIPTION OF THE INVENTION

Figure 1:
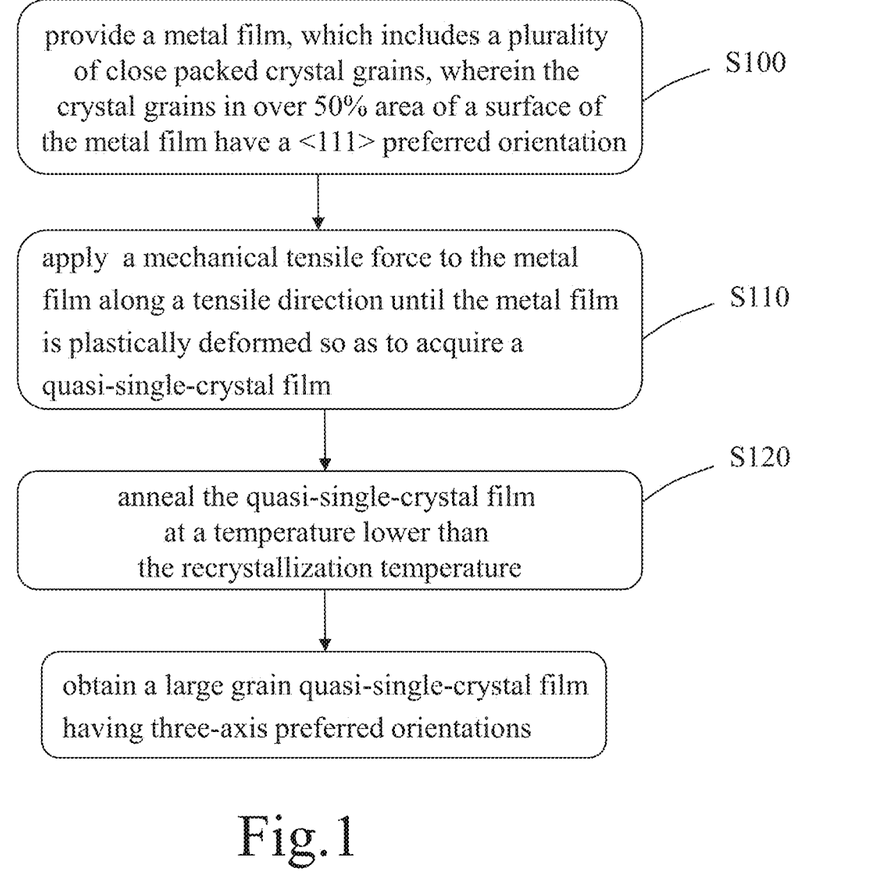
FIG. 1 is a flowchart of a method for manufacturing a large grain quasi-single-crystal film according to one embodiment of the present invention.

Refer to FIG. 1 for a flowchart of a method of manufacturing a large grain quasi-single-crystal film according to one embodiment of the present invention. The method of manufacturing a large grain quasi-single-crystal film comprises Steps S100, S110 and S120.

Figure 2A:
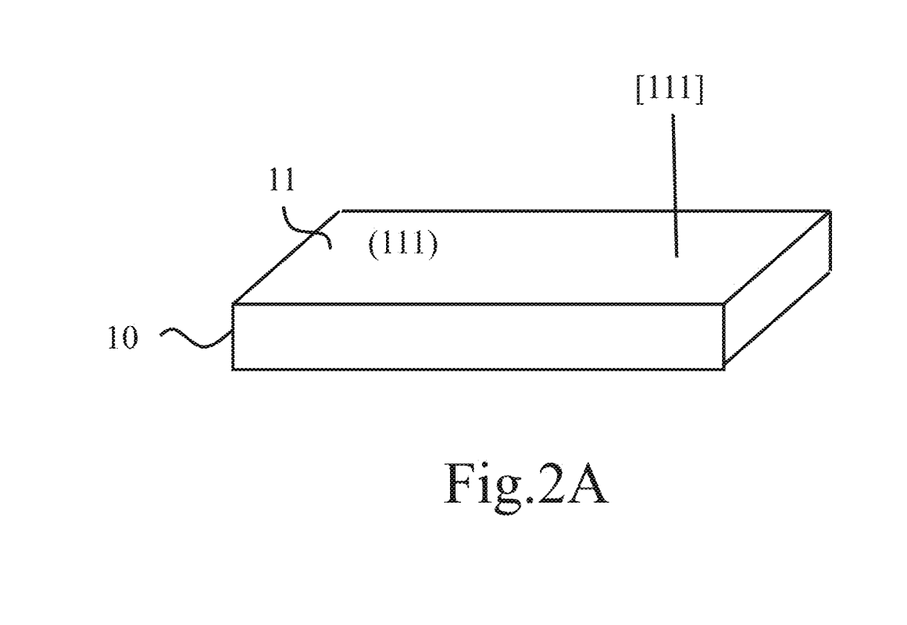
FIG. 2A schematically shows a metal film used by the present invention.

Refer to FIG. 2A. In Step S100, provide a metal film 10, which includes a plurality of close packed crystal grains. The crystal grains in over 50% area of a surface 11 of the metal film 10 have a <111> preferred orientation. The surface 11 of the metal film 10 is referred to the upper surface and/or the lower surface of the metal film 10.

In one embodiment, the surface 11 of the metal film 10 is a (111) crystallographic plane; the metal film 10 has a plurality of columnar crystal grains; the material of the metal film may be selected from a group including silver, copper, nickel, palladium and magnesium.

In one embodiment, the metal film 10 is a nano-twinned copper film formed by a plurality of nano-twinned structures; the surface 11 of the metal film 10 is a (111) crystallographic plane; the nano-twinned copper film has a significant <111> preferred orientation and a high density of nano-twins. Refer to the electrodeposited nano-twinned copper film and the manufacturing method thereof described in the U.S. Pat. No. 10,094,033, which is incorporated herein by reference.

Figure 2B:
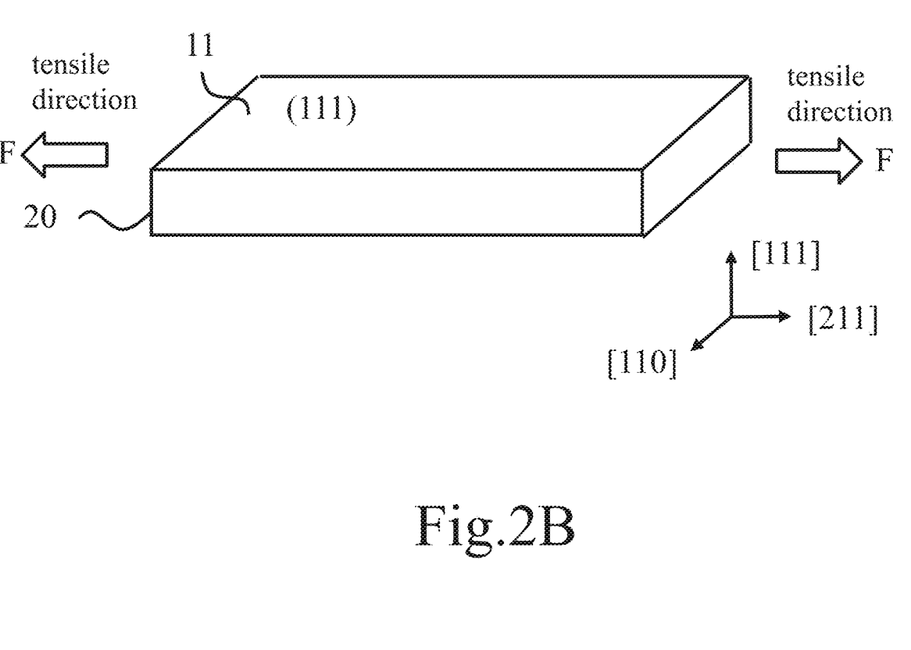
FIG. 2B schematically shows that a mechanical tensile force is applied to a metal film to generate a large grain quasi-single-crystal film according to one embodiment of the present invention.

Refer to FIG. 2B. In Step S110, apply a mechanical tensile force F to the metal film 10 provided in Step S100 at an ambient temperature or a temperature higher than the ambient temperature until the metal film 10 is plastically deformed, whereby the crystal grains of the metal film 10 is rotated to generate more ordered packing, wherefore is obtained a quasi-single-crystal film 20 having preferred orientations in three axes. In the quasi-single-crystal film 20, the crystal grains in 50% area have a <211> preferred orientation along the direction of the mechanical tensile force; the crystal grains in 50% area have a <110> preferred orientation along the direction vertical to the mechanical tensile force; the crystal grains in 50% area of the original surface of the quasi-single-crystal film 20 still keep the <111> preferred orientation.

In one embodiment, as long as the mechanical tensile force F generates over 10% plastic deformation of the metal film 10, it is sufficient to rotate the crystal grains and promote the preferred orientations in the tensile direction and the direction vertical to the tensile direction.

In one embodiment, the quasi-single-crystal film 20 has a single-layer structure or a multilayer composite structure; a cover layer is formed on at least one surface of the multilayer composite structure.

In Step S120, after the metal film 10 is plastically deformed to generate the quasi-single-crystal film 20 in Step S110 using, anneal the quasi-single-crystal film 20 at a temperature lower than the recrystallization temperature to form large crystal grains, whereby is obtained a large grain quasi-single-crystal film with the surface thereof keeping the <111> preferred orientation.

In one embodiment, the annealing is undertaken for one hour at a temperature of 100-500° C. The average diameter of the crystal grains of the large grain quasi-single-crystal film is over 500 μm.

Below, a demonstrative embodiment is used to explain the method of using a nano-twinned copper film to manufacture a large grain quasi-single-crystal film. Firstly, use a DC electroplating method to fabricate a nano-twinned copper film with the crystal grains arranged toward a <111> crystallographic axis. The method of fabricate the nano-twinned copper film includes the following processes. Firstly, prepare an electrolytic solution using a high-purity copper sulfate solution, an appropriate surfactant, 50 g/L sulfuric acid, and 40 p.p.m hydrogen chloride; use a 99.99% high-purity copper plate as the cathode; use a silicon wafer as the substrate; coat polyimide on the wafer as a peel layer; sputter a 100 nm thick titanium layer as a adhesion layer; use Oerlikon ClusterLine 300 (OC Oerlikon Corporation AG, Pfäffikon, Switzerland) to sputter an about 200 nm thick copper layer having a [111] preferred orientation on the adhesion layer as a seed layer.

The silicon wafer may be cut into 3×12 cm² silicon chips, and the silicon chips are immersed into the electrolytic solution. The nano-twinned copper film is grown at a current density of 40 mA cm⁻² and a deposition rate of 12.5 nm s⁻¹ with the agitator rotating at a speed of 1200 r.p.m. Thereby is obtained a nano-twinned copper film with the crystal grains thereof highly close and orderly packed toward a <111> crystallographic axis.

Next, peel off the nano-twinned copper film with the crystal grans thereof packed toward a <111> crystallographic axis from the silicon chips. Thus, the nano-twinned copper film is separated from the silicon chip, and the polyimide is left on the silicon chip. After separation, the nano-twinned copper film may be directly stretched. Alternatively, the nano-twinned copper film is annealed at a temperature lower than 400° C. and then stretched. The stretching is undertaken at an ambient temperature and a strain rate of 0.004 (1/s). Refer to FIG. 2B. A mechanical tensile force F is applied to the nano-twinned copper film to plastically deform the nano-twinned copper film until the nano-twinned copper film has a deformation of 20%.

In the embodiment, a mechanical tensile force is applied to the nano-twinned copper film having columnar crystals at an ambient temperature or a temperature higher than the ambient temperature to rotate the columnar crystals and generate a quasi-single-crystal copper film having a (111) crystallographic plane. The structure of the nano-twinned copper film may be modified with appropriate processes, and the preferred orientation of the surface thereof may be controlled to be the (111) crystallographic plane. Appropriate deformation makes the crystal grains of the nano-twinned copper film packed more orderly. After deformation, the <211> crystallographic axis of the quasi-single-crystal copper film is aligned toward the tensile direction; the <110> crystallographic axis is aligned toward the direction vertical to the tensile direction; the original <111> preferred orientation of the surface is kept. Therefore is achieved a quasi-single-crystal structure having three-axis preferred orientations.

In the embodiment, after the nano-twinned copper film is separated from the chip, an electron back-scattered diffraction (EBSD) technology is used to detect the orientations of the crystal grains of the nano-twinned copper film. The electron back-scattered diffraction is undertaken at a voltage of 20 kV with a JEOL 7800F field-emission scanning electron microscope (JEOL Ltd., Tokyo, Japan).

Figure 3A:
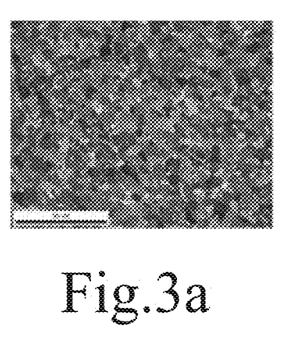
FIGS. 3a-3f show orientation image maps of EBSD for nano-twinned copper films before and after plastic deformation by a mechanical tensile force according to one embodiment of the present invention.
Figure 3B:
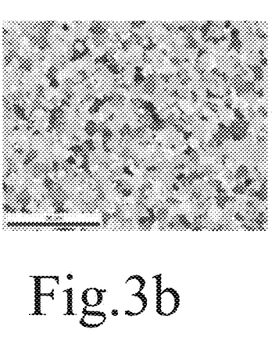
Figure 3C:
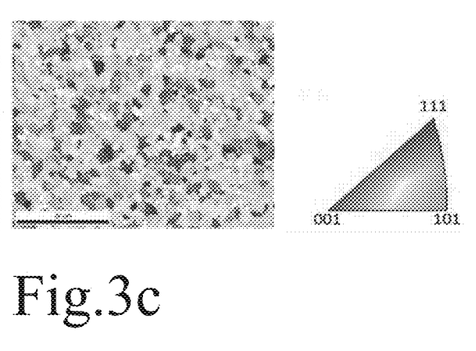

Refer to FIGS. 3a-3c. Before a mechanical tensile force is applied, only the surface of the nano-twinned copper film has the <111> preferred orientation, and the other two axes have no preferred orientation. FIG. 3a shows the analysis result of the preferred orientation of the surface of the nano-twinned copper film before a mechanical tensile force is applied. It is found in FIG. 3a: the abovementioned electroplating method can obtain the nano-twinned copper film with the surface crystal grains having the <111> preferred orientation, and the average size of the crystal grains is about 3.1 μm. FIG. 3b and FIG. 3c respectively show a plane viewed from the tensile direction and a plane viewed from the direction vertical to the tensile direction. It is found in FIG. 3b and FIG. 3c: neither the plane viewed from the tensile direction nor the plane viewed from the direction vertical to the tensile direction has any preferred orientation; however, the crystal grains of the plane viewed from the tensile direction and the crystal grains of the plane viewed from the direction vertical to the tensile direction are mainly oriented toward the <110> and <211> crystallographic axes.

Figure 3D:
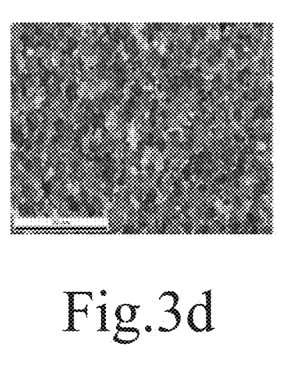
Figure 3E:
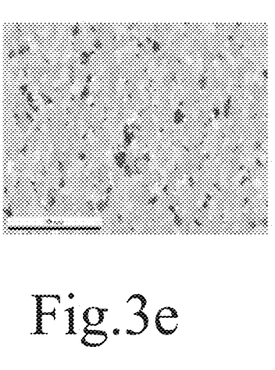
Figure 3F:
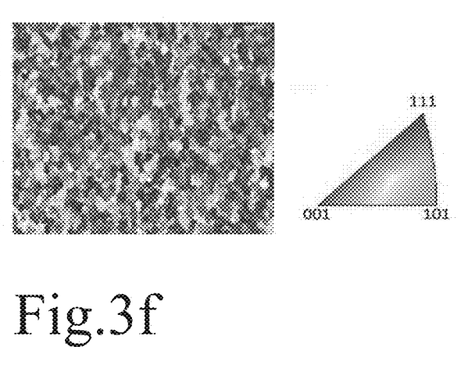

Refer to FIGS. 3d-3f. After a mechanical tensile force is applied, the surface of the nano-twinned copper film keeps the <111> preferred orientation; the crystal grains of the plane viewed from the tensile direction and the crystal grains of the plane viewed from the direction vertical to the tensile direction respectively have the <211> preferred orientation and the <110> preferred orientation. In details, FIG. 3d shows the analysis result of the preferred orientation of the surface of the nano-twinned copper film after a mechanical tensile force is applied. It is found in FIG. 3d: stretching does not affect the <111> preferred orientation of the surface of the nano-twinned copper film. The crystal grains of the plane viewed from the tensile direction are rotated to have the <211> preferred orientation along the tensile direction, as shown in FIG. 3e. The crystal grains of the plane viewed from the direction vertical to the tensile direction are rotated to have the <110> preferred orientation along the direction vertical to the tensile direction, as shown in FIG. 3f. Therefore, the analysis results show that the plastically deformed nano-twinned copper film has preferred orientations in three axes.

Figure 4A:
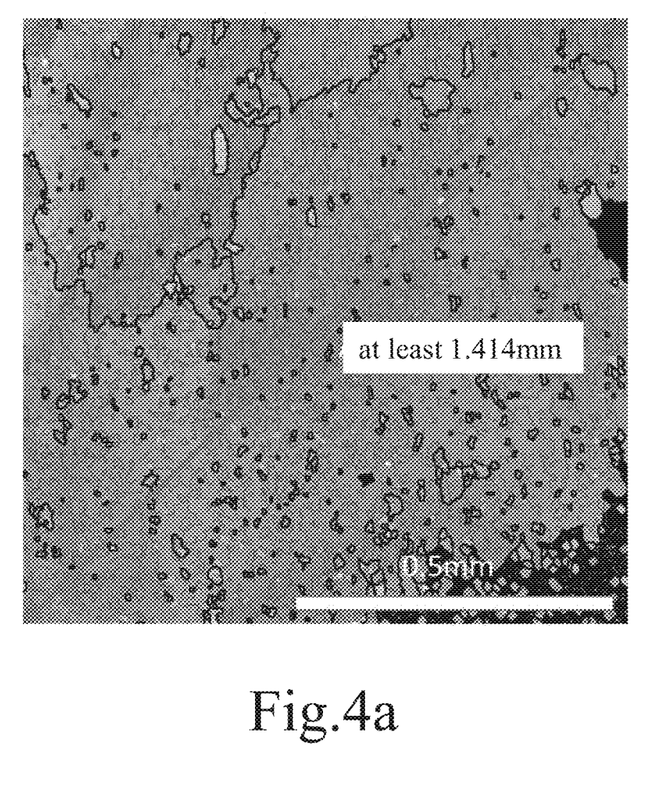
FIGS. 4a-4c show orientation image maps of EBSD for plastically deformed and annealed nano-twinned copper films according to one embodiment of the present invention.
Figure 4B:
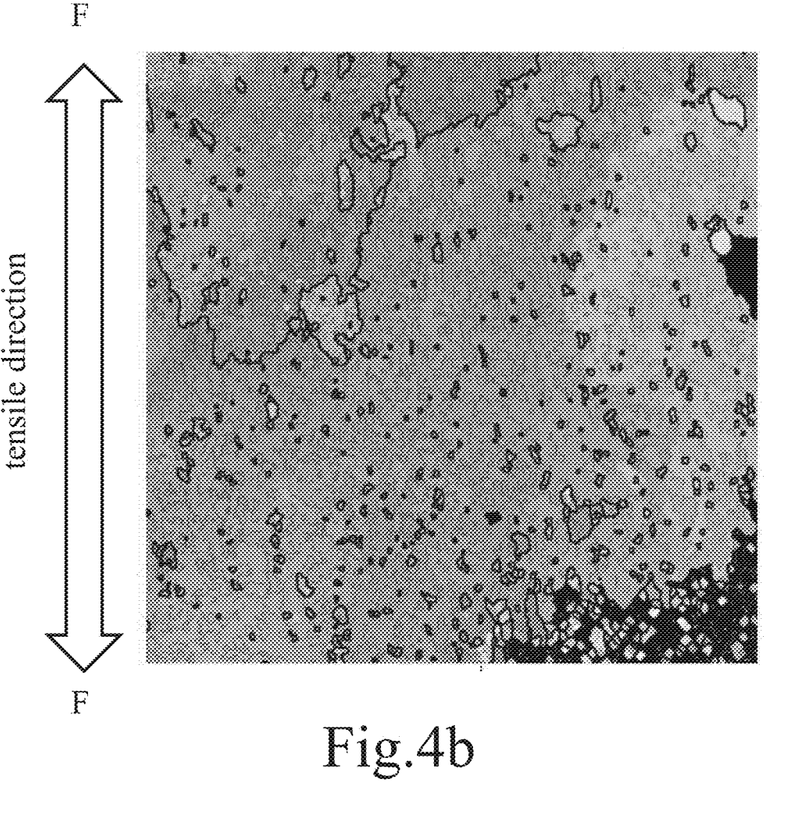
Figure 4C:
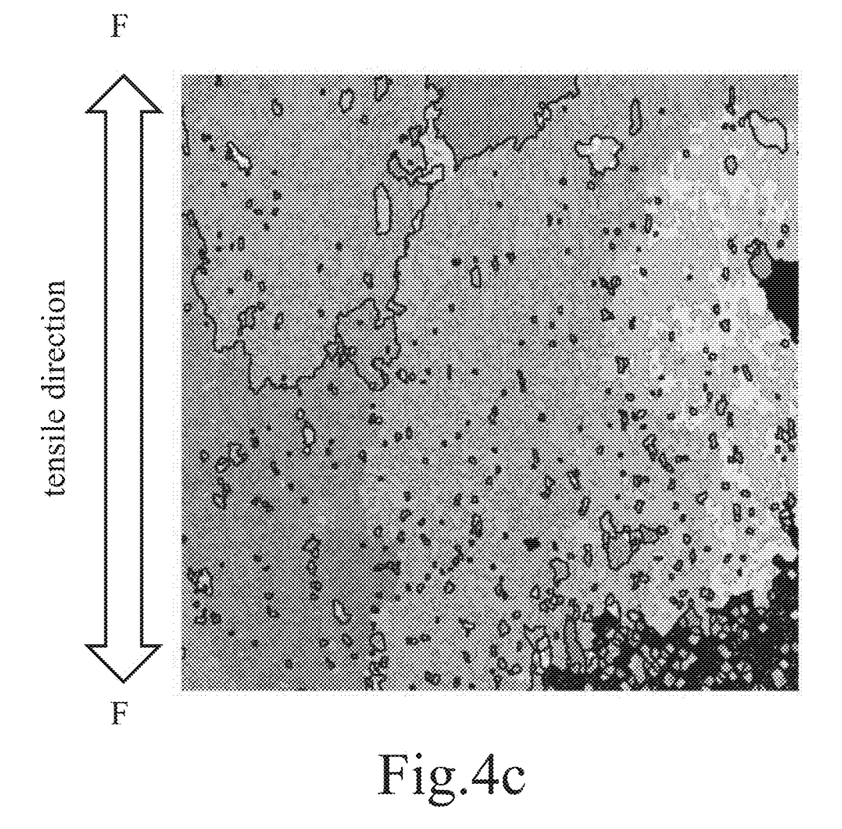

Next, anneal the plastically deformed nano-twinned copper film at a temperature of 250° C. for one hour in an environment of nitrogen or vacuum. The results of the EBSD surface analysis are shown in FIGS. 4a-4c. It is shown in FIG. 4a: the annealing generates ultra-large crystal grains whose diameters are over 1.4 mm, and the surface of the nano-twinned copper film keeps the <111> preferred orientation. FIG. 4b shows that the crystal grains of the plane viewed from the tensile direction of the annealed nano-twinned copper film are rotated from the <211> preferred orientation to the <110> preferred orientation. FIG. 4c shows that the crystal grains of the plane viewed from the direction vertical to the tensile direction are rotated from the <110> preferred orientation to the <211> preferred orientation. In this embodiment, the annealing process successfully fabricates the nano-twinned copper film having significant preferred orientations into a large grain quasi-single-crystal film whose surface has the <111> preferred orientation. Further, the EBSD analysis proves that the large grain quasi-single-crystal film has preferred orientations in three axes. The large grain quasi-single-crystal film may be used a 2-dimensional substrate for growing another material, such as a substrate for growing molybdenum disulfide (MoS₂) or graphene.

The material of a copper film has a face-centered cubic structure. The deformation of copper is not likely to take place on the (111) crystallographic plane. The quasi-single-crystal copper film having the preferred orientation on the surface thereof cannot be mass produced but can only be slowly manufactured in a sputtering method or a laser epitaxial deposition method. However, the abovementioned embodiments prove that the present invention can achieve a copper film having ultra large grains and three-axis preferred orientations merely via applying a mechanical tensile force to induce plastic deformation and annealing the plastically deformed copper film.

In conclusion, the present invention proposes a large grain quasi-single-crystal film, wherein a metal film having a <111> preferred orientation in the surface thereof is plastically deformed by a mechanical tensile force to induce rotation of crystal grains and arrange the crystal grains more orderly, whereby the preferred orientations also appear in the tensile direction and the direction vertical to the tensile direction, wherefore is obtained a quasi-single-crystal structure having preferred orientations in three axes. After annealing, the crystal grains grow into large grains and keeps the original <111> preferred orientation.

At present, 2-dimensional materials are developing prosperously. For an example, graphene is a 2-dimensional material, applicable to transistors, biosensors, batteries, medicine encapsulation, etc. For another example, borophene is also a 2-dimensional material; borophene maybe produced in a vapor deposition method; borophene has characteristics of metals and may be used in printed circuit boards. The present invention can use a simple mechanical force to plastically deform a metal film and align crystal grains orderly to have three-axis preferred orientations and use an annealing process to make crystal grains grow into large grains. The method of the present invention is a simple, fast, low-cost and high-efficiency method, able to mass produce a large-area quasi-single-crystal film having high anisotropy and a <111> preferred orientation on the surface thereof. The large grain quasi-single-crystal film, of the present invention may be used to grow 2-dimensional materials or develop anisotropic structures.

The embodiments described above are to demonstrate the technical thoughts and characteristics of the present invention and enable the persons skilled in the art to understand, make, and use the present invention. However, these embodiments are not intended to limit the scope of the present invention. Any equivalent modification or variation according to the spirit of the present invention is to be also included by the scope of the present invention.

What is claimed is:

1. A large grain quasi-single-crystal film, comprising a plurality of close packed crystal grains, wherein said crystal grains in over 50% area of a surface of said large grain quasi-single-crystal film have a <111> preferred orientation; after an annealing process and a mechanical tensile force is applied to a nano-twins copper film along a stretching direction such that the nano-twins copper film is plastically deformed and annealed to obtain the large grain quasi-single-crystal film, said crystal grains in over 50% area has a <110> preferred orientation along a tensile direction, said crystal grains in over 50% area has a <211> preferred orientation along a direction vertical to said tensile direction, and said crystal grains in over 50% area has a <111> preferred orientation; said crystal grain has an average diameter of over 500 µm.

2. The large grain quasi-single-crystal film according to claim 1, wherein said surface is a (111) crystallographic plane.

3. The large grain quasi-single-crystal film according to claim 1, wherein said large grain quasi-single-crystal film includes a plurality of columnar crystal grains.

4. The large grain quasi-single-crystal film according to claim 1, wherein said large grain quasi-single-crystal film includes a single layer structure or a multilayer composite structure.

5. The large grain quasi-single-crystal film according to claim 4, wherein a cover layer is formed on at least one surface of said multilayer composite structure.

6. A method for manufacturing a large grain quasi-single-crystal film, comprising steps:
providing a metal film, which includes a plurality of close packed crystal grains, wherein said crystal grains in over 50% area of a surface of said metal film has a <111> preferred orientation;
applying a mechanical tensile force to said metal film along a tensile direction until said metal film is plastically deformed to acquire a quasi-single-crystal film; and
annealing said quasi-single-crystal film at a temperature lower than a recrystallization temperature to acquire a large grain quasi-single-crystal film, wherein said crystal grains in over 50% area of said large grain quasi-single-crystal film has a <110> preferred orientation along said tensile direction; said crystal grains in over 50% area of said large grain quasi-single-crystal film has a <211>preferred orientation along a direction vertical to said tensile direction; said crystal grains has an average diameter of over 500 µm.

7. The method for manufacturing a large grain quasi-single-crystal film according to claim 6, wherein said crystal grains in over 50% area of said quasi-single-crystal film has a <211> preferred orientation along said tensile direction; said crystal grains in over 50% area of said quasi-single-crystal film has a <110> preferred orientation along a direction vertical to said tensile direction.

8. The method for manufacturing a large grain quasi-single-crystal film according to claim 6, wherein said surface is a (111) crystallographic plane.

9. The method for manufacturing a large grain quasi-single-crystal film according to claim 6, wherein said metal film includes a plurality of columnar crystal grains.

10. The method for manufacturing a large grain quasi-single-crystal film according to claim 6, wherein said metal film is made of a material selected from a group including silver, copper, nickel, palladium and magnesium.

11. The method for manufacturing a large grain quasi-single-crystal film according to claim 6, wherein said step of applying a mechanical tensile force makes said metal film have an over 10% deformation.

12. The method for manufacturing a large grain quasi-single-crystal film according to claim 6, wherein said step of annealing is undertaken at a temperature of 100-500° C. for one hour.

* * * * *